(12) United States Patent
Weyers et al.

(10) Patent No.: US 8,530,300 B2
(45) Date of Patent: Sep. 10, 2013

(54) SEMICONDUCTOR DEVICE WITH DRIFT REGIONS AND COMPENSATION REGIONS

(75) Inventors: Joachim Weyers, Hoehenkirchen (DE); Armin Willmeroth, Augsburg (DE); Anton Mauder, Kolbermoor (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 209 days.

(21) Appl. No.: 12/842,488

(22) Filed: Jul. 23, 2010

(65) Prior Publication Data

US 2012/0018856 A1    Jan. 26, 2012

(51) Int. Cl.
*H01L 21/8238* (2006.01)

(52) U.S. Cl.
USPC ........... 438/212; 438/268; 257/328; 257/341; 257/342; 257/E29.256; 257/E21.418

(58) Field of Classification Search
USPC .......... 257/328, 341, 342, E21.418, E29.197, 257/E29.256, E29.257; 438/212, 268
See application file for complete search history.

(56) References Cited

U.S. PATENT DOCUMENTS

| | | |
|---|---|---|
| 7,541,260 B2 | 6/2009 | Pfirsch et al. |
| 2006/0027861 A1* | 2/2006 | Takaishi ......................... 257/330 |
| 2007/0023830 A1 | 2/2007 | Pfirsch et al. |
| 2007/0176229 A1 | 8/2007 | Willmeroth et al. |
| 2009/0189216 A1* | 7/2009 | Werner et al. ................. 257/328 |
| 2009/0218621 A1 | 9/2009 | Pfirsch et al. |

FOREIGN PATENT DOCUMENTS

| | | |
|---|---|---|
| DE | 102006002065 A1 | 7/2007 |
| WO | 2007012490 A2 | 2/2007 |

* cited by examiner

*Primary Examiner* — A. Sefer
*Assistant Examiner* — Farid Khan
(74) *Attorney, Agent, or Firm* — Murphy, Bilak & Homiller, PLLC

(57) ABSTRACT

Disclosed is a method of forming a semiconductor device with drift regions of a first doping type and compensation regions of a second doping type, and a semiconductor device with drift regions of a first doping type and compensation regions of a second doping type.

24 Claims, 7 Drawing Sheets

A-A

SEMICONDUCTOR DEVICE WITH DRIFT REGIONS AND COMPENSATION REGIONS

FIELD OF THE INVENTION

Embodiments of the present invention relate to a method for producing a semiconductor device, in particular a power semiconductor device, with drift regions and compensation regions, and to a semiconductor device, in particular a power semiconductor device, with drift regions and compensation regions.

BACKGROUND

Power semiconductor devices, like power MOSFETs, or power diodes, are widely used in high power applications. Power devices, depending on their specific design, can have a voltage blocking capability ranging from several ten volts to several hundred volts or even some kilovolts. One challenge in the design of power semiconductor device is to provide a low on-resistance at a given blocking voltage capability.

Power semiconductor devices include a pn-junction that is formed between a p-doped semiconductor region and an n-doped semiconductor region. The component blocks when the pn-junction is reverse-biased. In this case a depletion region or space charge region propagates in the p-doped and n-doped regions. Usually one of these semiconductor regions is more lightly doped than the other one of these semiconductor regions, so that the depletion region mainly extends in the more lightly doped region, which mainly supports the voltage applied across the pn-junction. The semiconductor region supporting the blocking voltage is referred to as drift region in an MOSFET, and is referred to as base region in a diode.

Superjunction or compensation components additionally to a drift or base region include compensation regions which are doped complementarily to the drift region and which are arranged adjacent to the drift regions. When a blocking voltage is applied to the pn-junction of such component and a depletion region propagates in the drift region, dopant charges present in the drift region and dopant charges present in the compensation regions compensate one another. Thus, in order to obtain a given voltage blocking capability, the drift region in a superjunction device can be more highly doped than the drift region in a conventional device, which results in a lower on-resistance.

Drift regions and compensation regions of a superjunction device are, for example, formed by epitaxially growing a plurality of semiconductor layers one above the other. In these epitaxially grown semiconductor layers n-type dopant regions and p-type dopant region are formed such that within the individual semiconductor layers n-type dopant regions and p-type dopant regions are arranged alternatingly, and such that in the arrangement with the plurality of semiconductor layers p-type dopant regions are arranged one above the other and n-type dopant regions are arranged one above the other. Dopants of the p-type dopant regions and n-type dopant regions are then diffused into surrounding semiconductor regions by heating-up the semiconductor body to a desired diffusion temperature. Dopants that diffuse from n-type dopant regions arranged one above the other form an n-doped column extending in a vertical direction of the semiconductor layer arrangement, and dopants from the p-type dopant regions form a p-doped column in the semiconductor layer arrangement. These n-doped and p-doped columns form drift and compensation regions in the completed device.

One further challenge in the design of power semiconductor devices is to shrink the devices, i.e. to reduce their size, without reducing their current bearing capability and their voltage blocking capability. Shrinking a superjunction device requires reducing the size of the n-doped and p-doped columns in a direction which is a direction perpendicular to the current flow direction in the device. In the diffusion process explained hereinabove the n-type dopants and the p-type dopants do not only diffuse in the vertical direction of the semiconductor layer arrangement, but also diffuse in the horizontal direction. Due to this diffusion in the horizontal direction the size of the n-doped and p-doped columns cannot be reduced arbitrarily.

According to a further known method, a plurality of semiconductor layers is epitaxially grown one above the other on a semiconductor substrate, wherein in each of these semiconductor layers n-type dopant regions and p-type dopant regions are produced to be arranged alternatingly within the individual semiconductor layers and one above the other in a vertical direction of the semiconductor layer arrangement. In this semiconductor layer arrangement trenches are formed between the n-type dopant regions and the p-type dopant regions, and these trenches are filled with a filling material, like a dielectric material. These trenches filled with the isolation material limit the diffusion of n-type dopant and p-type dopant in the horizontal direction, so that narrow n-doped and p-doped columns can be formed.

This method, however requires that deep trenches are formed which extend through the plurality of epitaxially grown semiconductor layers. Trenches in semiconductor material cannot be produced to be perfectly vertical, i.e. such trenches are usually inclined relative to the vertical direction. This has the effect that an opening at the top of a trench is offset relative to the bottom of the trench. With a trench depth of, for example, 50 µm an angle of 0.5° already results in an offset of several 100 nm. The smallest possible dimension of an n-doped column or a p-doped column is given by the smallest possible distance between two trenches. Due to the inclination of deep trenches and the offset resulting therefrom, the distance between two trenches and, therefore, the dimension of the n-doped and p-doped columns cannot be reduced arbitrarily.

There is, therefore, a need for providing semiconductor devices with narrow n-doped and p-doped columns arranged next to each other in a semiconductor body.

SUMMARY

A first aspect relates to a method of forming a semiconductor device with drift regions of a first doping type and compensation regions of a second doping type. The method includes providing a first semiconductor layer, and forming a plurality of layer stack arrangements one above the other on the first semiconductor layer, each layer stack arrangement comprising at least one second semiconductor layer, a plurality of first dopant regions with dopants of the first doping type and a plurality of second dopant regions with dopants of the second dopant type, at least some of the first dopant regions and at least some of the second dopant regions being arranged alternatingly and distant from another, and interlayer segments between at least some neighbouring first and second dopant regions. The interlayer segments are formed separately for each of the layer stack arrangements, and the first dopant regions and the second dopant regions of two adjacent layer stack arrangements are formed such that at least some of the first dopant regions are arranged substantially one above the other in a first direction and at least some of the second dopant regions are arranged substantially one above the other in the first direction. The method further includes diffusing the dopants of the first and second dopant regions such that drift regions are formed from dopants of first dopant regions, and such that compensation regions are formed from dopants of second dopant regions.

A second aspect relates to a semiconductor device with a plurality of drift regions of a first doping type and a plurality of compensation regions of a second dopant type. The plurality of the drift regions and the plurality of the compensation regions are arranged alternatingly, wherein each of the drift regions and each of the compensation regions extends across a plurality of semiconductor layers arranged one above the others in a first direction. Further, at least some of the drift regions are each separated from a neighbouring compensation region by an interlayer which includes a plurality of interlayer segments arranged in the semiconductor layers.

A third aspect relates to a method of forming a semiconductor device with drift regions of a first doping type and compensation regions of a second doping type. The method includes providing a first semiconductor layer, and forming a plurality of layer stack arrangements one above the other on the first semiconductor layer. Each layer stack arrangement includes at least one second semiconductor layer with a basic doping of a first doping type, a plurality of dopant regions with dopants of the second doping type which are arranged distant from one another in a second direction, and two interlayer segments between at least some neighbouring dopant regions, wherein the two interlayer segments are arranged distant from one another in the second direction. The interlayer segments are formed separately for each of the layer stack arrangements, wherein the dopant regions of two adjacent layer stack arrangements are formed such that at least some of the dopant regions are arranged substantially one above the other in a first direction. The method further includes diffusing the dopants of the dopant regions such that one of the drift regions and compensation regions are formed from dopants of the dopant regions, wherein the other one of the drift regions and compensation regions are formed from regions with the basic doping of the second semiconductor layers.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1 which includes

FIG. 2 which includes

FIG. 5 which includes

DETAILED DESCRIPTION

FIGS. 1A to 1F illustrate a first embodiment of a method for producing n-doped and p-doped columns which are arranged next to each other in a semiconductor body and which are at least partially separated from one another by interlayers. This method is, in particular, useful in the production of power semiconductor devices, like power transistors or power diodes, in which n-doped and p-doped semiconductor columns are required as drift regions and compensation regions.

Figure 1A:
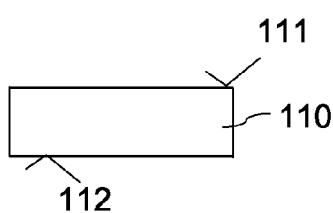
FIGS. 1A to 1F illustrates a first embodiment of a method for producing n-type and p-type columns separated by interlayers.

Referring to FIG. 1A, a first semiconductor layer 110 with a first surface 111 and a second surface 112 is provided in a first step. The first semiconductor layer 110 is, for example, a semiconductor substrate. FIG. 1A illustrates a cross section of the first semiconductor layer 110 in a vertical section plane, which is a plane perpendicular to the first and second surfaces 111, 112. The first semiconductor layer 110 can be made from a conventional semiconductor material, like silicon (Si), silicon carbide (SiC), gallium nitride (GaN), or gallium arsenide (GaAs). It should be mentioned in this connection that the material of epitaxial layers which, referring to the description hereinbelow, are formed on the first layer corresponds to the material of the first layer 110.

The first semiconductor layer 110 can be highly doped and can have a doping concentration in the range of between $10^{18}$ $cm^{-3}$ and $10^{22}$ $cm^{-3}$. The first semiconductor layer 110, or at least parts of the first semiconductor layer 110, can serve as an active component region, like a drain region in a MOSFET or an emitter zone in a diode, in the completed component.

Figure 1B:
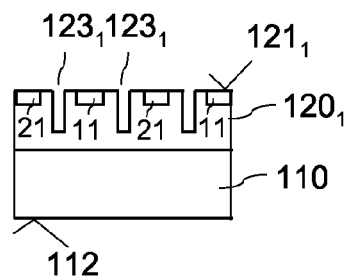

Referring to FIG. 1B a first one of a plurality of layer stack arrangements is produced on the first surface 111 of the first semiconductor layer 110. The layer stack arrangement includes at least one second semiconductor layer $120_1$ which is, in particular, a monocrystalline semiconductor layer epitaxially grown on the first semiconductor layer 110. Producing the layer stack arrangement further includes producing a plurality of first and second dopant regions 11, 21, wherein the first and second dopant regions 11, 21 are arranged alternatingly in the at least one second semiconductor layer $120_1$. The first dopant regions 11 are, for example, formed by implanting dopants of a first dopant type via a first surface $121_1$ of the semiconductor layer $120_1$ into the semiconductor layer $120_1$, and the second dopant regions 11 are, for example, formed by implanting dopants of a second dopant type into the semiconductor layer $120_1$. In the embodiment illustrated in FIG. 1B, the first surface $121_1$ of the second semiconductor layer $120_1$ is the surface of the second semiconductor layer $120_1$ facing away from the first semiconductor layer 110.

Further, trenches $123_1$ are formed to extend from the first surface $121_1$ substantially in a first direction. In the embodiment illustrated in FIG. 1, the first direction is the vertical direction of the second semiconductor layer $120_1$. The "vertical direction" of the second semiconductor layer $120_1$ is the direction perpendicular to the first surface $121_1$. The trenches $121_3$ are formed between neighboring first and second dopant regions 11, 21. These trenches $123_1$, therefore, separate or isolate the first and second dopant regions 11, 21 from one another. In the embodiment illustrated in FIG. 1B the trenches $123_1$ are formed to not extend completely through the layer stack arrangement with the at least one second semiconductor layer $120_1$. However, this is only an example. According to further embodiments, which will be explained herein further below, the trenches $123_1$ could extend completely through the layer stack with the at least one second semiconductor layer $120_1$ and even into the underlying semiconductor layer (110 in FIG. 1B). The first and second dopant regions 11, 21 can be produced before producing the trenches $123_1$, or can be produced after producing the trenches $123_1$, when the layer stack arrangement includes only one second semiconductor layer.

Figure 1C:
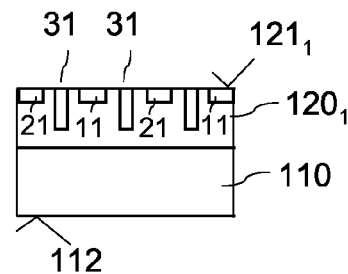

Referring to FIG. 1C the trenches $123_1$ are filled with a filling material so that interlayer segments 31 are formed between the first and second dopant regions 11, 21. The filling material is, for example, a dielectric material, like an oxide or a nitride.

Figure 1D:
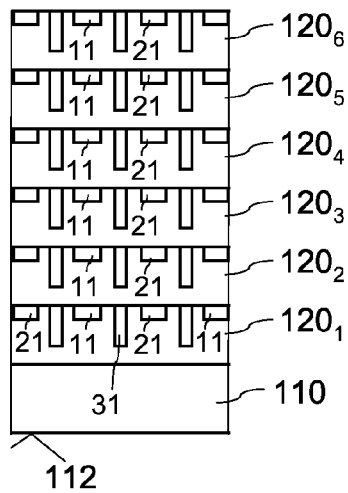
Figure 1E:
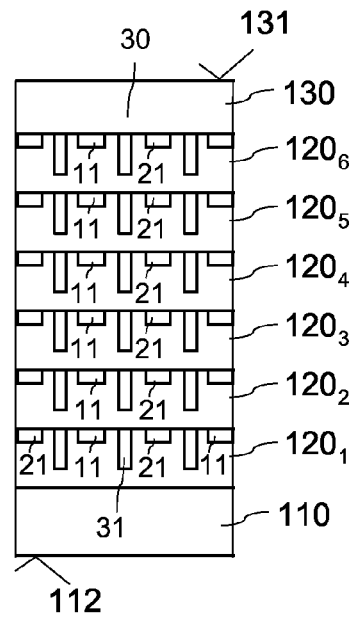

The method steps illustrated in FIGS. 1B and 1C for forming the first layer stack with at least one second semiconductor layer $120_1$, the first and second dopant regions 11, 21, and the interlayer segments 31 is repeated several times, so that, referring to FIG. 1D, a plurality of layer stacks are formed one above the other on the first semiconductor layer 120, wherein each of the layer stack arrangements includes at least one second semiconductor layer $120_1$-$120_6$. In each of these layer stacks with at least one second semiconductor layer $120_1$-$120_6$ first and second dopant regions 11, 21 and interlayer segments 31, which separate the first and second dopant regions 11, 21, from one another are formed. The interlayer segments of the individual layer stack arrangements are formed separately, i.e. interlayer segments 31 of one layer stack arrangement are formed before another layer stack arrangement is formed on the one layer stack arrangement.

In the embodiment illustrated in FIGS. 1A to 1F, each of the layer stack arrangements includes only one second semiconductor layer. However, this is only an example. Referring to FIGS. 2A and 2B, which illustrate a cross section through a layer stack arrangement according to a further embodiment, one layer stack arrangement can include a plurality of second semiconductor layers $120_{i1}$, $120_{i2}$, $120_{im}$ which are arranged one above the other. The layer stack arrangement illustrated in FIGS. 2A to 2B includes three second semiconductor layers $120_{i1}$, $120_{i2}$, $120_{im}$. However, this is only an example, the number of second semiconductor layers can be selected arbitrarily.

Referring to FIG. 2A first and second dopant regions 11, 21 are formed in each of the semiconductor layers $120_{i1}$, $120_{i2}$, $120_{im}$ of one layer stack arrangement, before, referring to FIG. 2B, in next method steps the interlayer segments 31 are formed. The interlayer segments can be formed to completely extend through one layer stack arrangement or to not completely extend through one layer stack arrangement.

In the embodiments illustrated hereinbelow, the individual layer stack arrangements include only one second semiconductor layer. However, this is only an example. These layer stack arrangements can also be produced to include several second semiconductor layers, wherein in each second semiconductor layer first and second dopant regions 11, 21 are formed and wherein interlayer segments are formed after the individual second semiconductor layers have been formed.

Referring to FIG. 1D, the first and second dopant regions 11, 21 in the arrangement with the plurality of layer stack arrangements or the plurality of second semiconductor layers $120_1$-$120_6$ are formed such that there are several groups with first dopant regions 11 and several groups with second dopant regions 21, wherein the first dopant regions of one group are arranged substantially one above the other in the vertical direction and the second dopant regions of one group are arranged substantially one above the other in the vertical direction. "Substantially one above the other in the vertical direction" means that the dopant regions in the vertical direction of the semiconductor layer arrangement are at least approximately arranged one above the other. "At least approximately" in this connection means, that the first or second dopant regions of two adjacent second semiconductor layers can be arranged offset to one another in the horizontal direction, wherein the offset is, for example, at most in the range of the width of the interlayer segment. The "width" of the interlayer segments is their dimension in the horizontal direction. The arrangement with the second semiconductor layers $120_1$-$120_6$ has two horizontal directions that run perpendicular to one another: a first horizontal direction extending substantially perpendicular to the interlayer segments 31; and a second horizontal direction extending perpendicular to the section planes illustrated in FIGS. 1A to 1F. In connection with the present description "horizontal direction" means the first horizontal direction, unless stated otherwise.

The arrangement illustrated in FIG. 1D includes six layer stack arrangement with one second semiconductor layer $120_1$-$120_6$ in each layer stack. This, however, is only an example. The number of layer stack arrangements and, therefore, the number of second semiconductor layers can be selected arbitrarily. According to further embodiments the semiconductor layer arrangement includes n=9 or n=15 second semiconductor layers. The individual layer stack arrangements can have identical numbers of second semiconductors, like a number of one second semiconductor layer in the embodiment of FIGS. 1A to 1F, or can have different numbers of second semiconductor layers.

The interlayer segments 31 in the individual layer stack arrangements are produced such that there are several groups of interlayer segments 31, wherein the interlayer segments of one group are arranged substantially one above the other in the vertical direction. "Substantially one above the other" means that the interlayer segments 31 can be slightly offset relative to each other in the horizontal direction. According to one embodiment the horizontal offset of two interlayer segments 31 arranged in adjacent second semiconductor layers $120_1$-$120_6$ is twice the thickness of the interlayer segments at most. The thickness of the interlayer segments 31 is their dimension in the horizontal direction. Those interlayer segments 31 that are aligned in the vertical direction form one interlayer 30, wherein, referring to FIG. 1D there are a plurality of interlayers 30 with each of these interlayers being arranged between first and second dopant regions 11, 21.

The second semiconductor layers $120_1$-$120_6$ can be undoped (intrinsic) or can have a basic doping concentration. According to one embodiment the second semiconductor layers have an n-type basic doping with a doping concentration of about $1 \cdot 10^{16}$ (1E16)cm$^{-3}$. A thickness of the individual second semiconductor layers is, for example, in the range of between 2 μm to 10 μm. The "thickness" of the second semiconductor layers $120_1$-$120_6$ is their dimension in the vertical direction. A mutual distance between two neighboring interlayer segments 31 in the individual second semiconductor layers $120_1$-$120_6$ is, for example, in the range of between 3 μm to 8 μm, in particular between 4 μm and 6 μm. This mutual distance between two neighboring isolation regions defines a "cell-pitch".

Figure 1F:
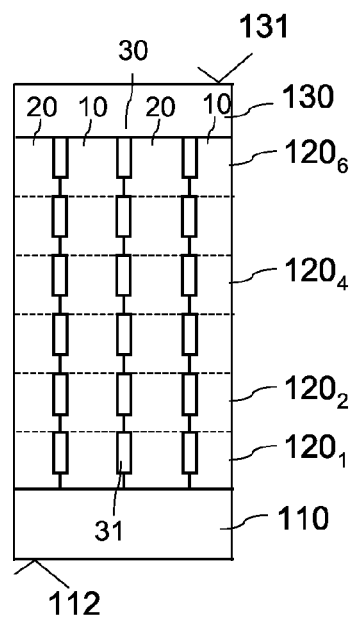
Figure 2A:
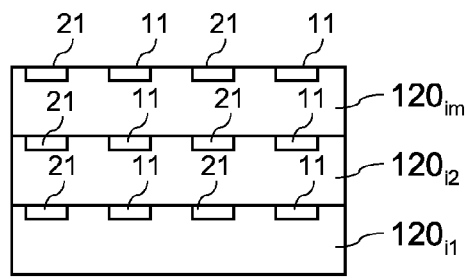
FIGS. 2A and 2B illustrates a modification of the method illustrated in FIG. 1.
Figure 2B:
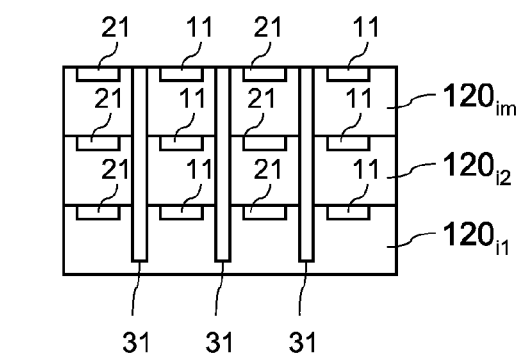

Referring to FIG. 1F a third semiconductor layer 130 is formed on the topmost layer stack arrangement. The "topmost layer stack arrangement" is that layer stack arrangement of the semiconductor layer arrangement which includes the furthermost layer relative to the first semiconductor layer 110. A thickness of the third semiconductor layer 130 is, for example, in the range of between 0.5 μm to 3 μm, in particular between 1 μm to 2 μm and its doping concentration is, for example, in the range of between $10^{15}$ cm$^{-3}$ and $10^{17}$ cm$^{-3}$ (1e15 cm–3 to 1e17 cm–3), in particular between $5·10^{15}$ cm$^{-3}$ and $5·10^{16}$ cm$^{-3}$ (5e15 cm–3 to 5e16 cm–3).

Referring to FIG. 1F, in next process steps a semiconductor body which includes the first semiconductor layer 110, the layer stacks with the second semiconductor layers $120_1$-$120_6$, and the third semiconductor layer 130 is subject to a temperature process in which the semiconductor body is heated to a diffusion temperature for a diffusion time. The diffusion temperature is, for example, in the range of between 1000° C. and 1300° C., the diffusion time is, for example, in the range of between 10 minutes and 300 minutes, in particular between 30 minutes and 180 minutes. During this thermal process or diffusion process dopants from the first and second dopant regions 11, 21 diffuse into the semiconductor regions surrounding the first and second dopant regions 11, 21. During the diffusion process the dopants from the first and second dopant regions 11, 21 are integrated into the crystal lattice of the surrounding semiconductor material and are, thus, activated. The dopants diffuse in each direction, wherein in the horizontal direction the interlayers 30 act as diffusion stop layers which prevent dopants from diffusing beyond the interlayers 30. In the vertical direction dopants diffuse across the borders between adjacent second semiconductor layers $120_1$-$120_6$, so that doped regions resulting from dopants of dopant regions in one second semiconductor layer merge with doped regions resulting from dopants of dopant region in an adjacent second semiconductor layer. As a result, the semiconductor body includes first semiconductor regions 10 doped with dopants of the first doping type and second semiconductor regions 20 doped with dopants of the second doping type, wherein each of these semiconductor regions in the vertical direction of the semiconductor body extends across the plurality of the second semiconductor layers $120_1$-$120_6$ and in the horizontal direction is limited by the interlayers 30. In this connection it should be mentioned that—especially when epitaxially growing the second semiconductor layers $120_1$-$120_6$—there is no visible border between the individual second semiconductor layers. Such borders are only shown for illustration purposes (in dashed lines) in FIG. 1F.

In the embodiment illustrated in FIG. 1F the temperature process is a dedicated temperature process which only serves for diffusing dopants from the dopant regions into the surrounding semiconductor material. However, this is only an example. According to a further embodiment, additional method steps are performed before performing the temperature process. These method steps may include the implantation of dopant atoms for the formation of additional active regions, like body and source regions (not shown in FIG. 1F) of a MOSFET. A temperature process performed after these additional steps can serve to form the first and second semiconductor regions 10, 20 and can serve to form the body and source regions. Of course it is also possible to perform a first temperature process before implanting the dopants for the source and body regions which does not completely form the first and second semiconductor regions, and to perform a second temperature process after implanting the dopants for the source and body regions, wherein this second temperature process forms the body and source regions and finishes the first and second semiconductor regions 10, 20.

During the diffusion process, dopants from the topmost second semiconductor layer $120_6$ do also diffuse into the third semiconductor layer. However, this is not explicitly illustrated in FIG. 1F.

The first and second semiconductor regions 10, 20 are separated from one another by the interlayers 30, with each of these interlayers 30 including a plurality of interlayer segments 31 that are aligned in the vertical direction, i.e. that are arranged substantially one above the other in the vertical direction. In the embodiment illustrated in FIG. 1F the interlayer segments 31 of the individual interlayers 30 are arranged distant to one another in the vertical direction. However, this is only an example. Further embodiments of interlayers 30 with a plurality of interlayer segments 31 will be illustrated with reference to FIGS. 7 to 10.

The first and second regions 10, 20 can be implemented to form drift regions and compensation regions of a power semiconductor device. For illustration purposes it may be assumed that the first semiconductor regions 10 form drift regions of the semiconductor device, and that the second semiconductor regions 20 form compensation regions of the semiconductor device.

Figure 3:
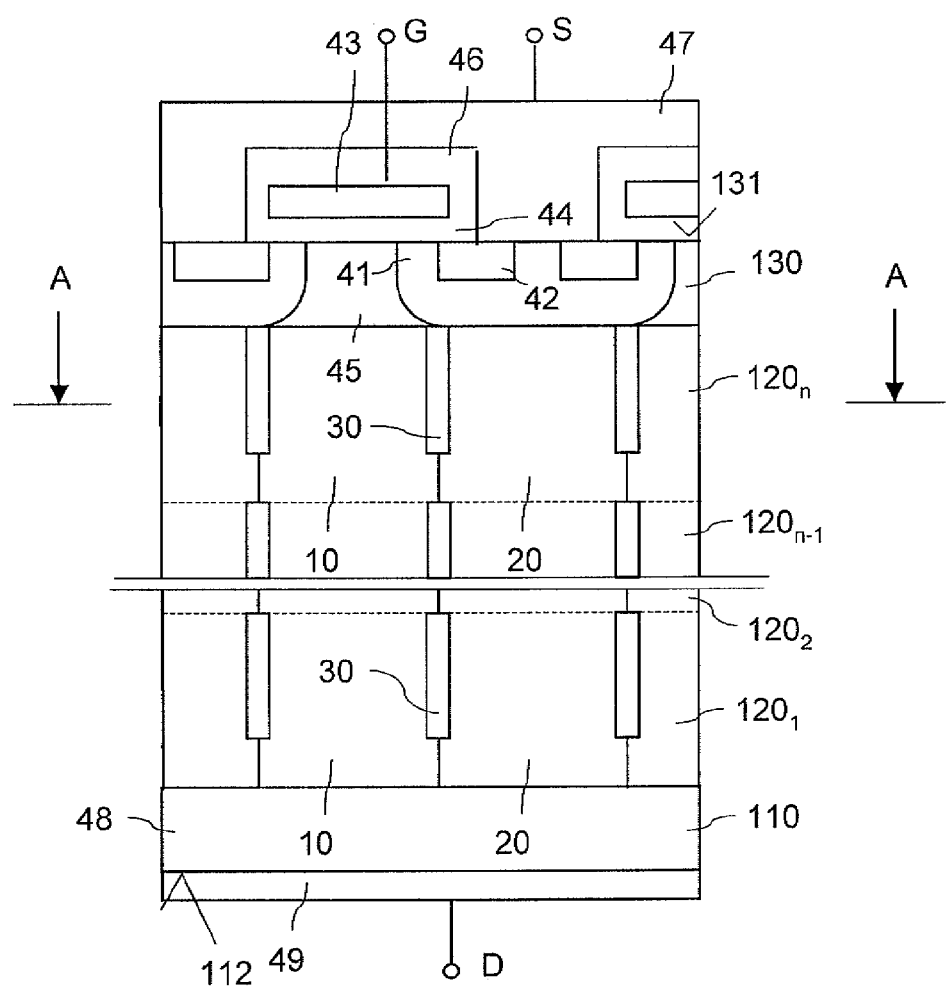
FIG. 3 illustrates an embodiment of a semiconductor device implemented as a transistor with complementarily doped drift regions and compensation regions separated by interlayers.

FIG. 3 illustrates a vertical cross section of a MOSFET which is implemented with a drift region 10 and a compensation region 20 structure according to FIG. 1F. For illustration purposes in FIG. 3 only a lowermost second semiconductor layer $120_1$, and a topmost second semiconductor layer $120_n$ are illustrated. The "lowermost second semiconductor layer" is the second semiconductor layer adjoining the first semiconductor layer 110, i.e. the second semiconductor layer of the first layer stack arrangement that was formed first, and the "topmost second semiconductor layer" is the second semiconductor layer that was produced at the very end of the second semiconductor layers. n in FIG. 3 denotes the overall number of second semiconductor layers which, for example, is n=6, n=9, or n=15.

Additionally to the structure illustrated in FIG. 1F the MOSFET according to FIG. 3 includes a plurality of transistor cells, with each of these transistor cells including in the third semiconductor layer 130 a body region 41 of the second doping type and a source region 42 of the first doping type. The body regions 41 of the individual transistor cells are, for example, produced such that each of these body regions 41 adjoins one of the compensation regions 20. Forming the source and body regions may, for example, include the implantation of dopant atoms, like Boron and Indium atoms, and the diffusion of the implanted dopant atoms into the surrounding semiconductor material using a thermal process, wherein this thermal process—referring to the explanation provided hereinbefore—can also serve to produce or finish the first and second semiconductor regions 10, 20.

The MOSFET further includes a gate electrode 43 which is common to the individual transistor cells and which is arranged adjacent to the body region 41 and is dielectrically insulated from the body region 41 by a gate dielectric 44. In the embodiment illustrated in FIG. 3 the individual transistor cells are planar transistor cells, i.e. the gate electrode 43 is a planar electrode which is arranged above the third semiconductor layer 130. However, this is only an example, the MOSFET could be implemented with any other transistor cells, like trench cells, in which the gate electrode is arranged in trenches, as well.

In the third semiconductor layer 130 between the body regions 41 of the individual transistor cells semiconductor regions 45 of the first doping type are arranged. Each of these semiconductor regions 45 adjoins one of the drift regions 10 formed in the second semiconductor layers $120_1$-$120_n$ and, thus, forms a part of the overall drift region of the MOSFET. The drift region section 45 in the third semiconductor layer 130 extends to the first surface 131 of the third semiconductor layer 130, wherein the first surface 131 is the surface of the third semiconductor layer 130 facing away from the topmost second semiconductor layer $120_n$. The doping concentration of the semiconductor region 45 is equal to a basic doping of the third semiconductor layer 130 according to a first embodiment. According to a further embodiment, the third semiconductor layer 130 has a lower doping than the semiconductor region 45, and the semiconductor region 45 is formed by the implantation of dopant atoms of the first doping type.

The body and source regions 41, 42 of the individual transistor cells are electrically connected to a common source electrode 47 which is electrically insulated from the gate electrode 43 by an insulation layer 46. In the MOSFET illustrated in FIG. 3 the first semiconductor layer 110 acts as a drain region 48 and has a drain electrode 49 produced on its second surface 112. In this connection it should be mentioned that a thickness of the first semiconductor layer 110 can be reduced before applying the drain electrode 48 by, for example, an etching method or a polishing method, like a chemical-mechanical polishing (CMP).

The MOSFET illustrated in FIG. 3 can be switched on and off like a conventional MOSFET. For explanation purposes it may be assumed that the MOSFET is an n-type MOSFET which has n-doped source and drift regions 42, 10, 45 and an n-doped drain region 110, and p-doped body and compensation regions 41, 20. The MOSFET is switched on (conducts) when a positive voltage is applied between drain and source terminals D, S formed by the drain and source electrodes 49, 47, and when an electrical potential is applied to the gate electrode 43, G which causes a conducting channel in the body region 41 between the source region 42 and the drift region 45 along the gate electrode 43. In an n-type and enhancement-type MOSFET the gate potential is a positive potential relative to the source potential (which is the electric potential at the source terminal S), and in an n-type and depletion-type MOSFET the gate potential is zero relative to the source potential. The MOSFET illustrated in FIG. 3 is an enhancement-type MOSFET. A depletion-type MOSFET would be obtained by providing an n-doped channel region in the body region 41 between the source region 42 and the drift region 45 along the gate electrode 43.

When the device is switched on, n-type charge carriers (electrons) flow between the drain terminal D and the source terminal S. When the component is switched off by interrupting the conducting channel between the source regions 42 and the drift regions 45, 10 and when there is still a positive voltage between the drain and source terminals D, S, the pn-junctions between the body regions 41 and the drift regions 45, 10 are reverse-biased, so that a depletion zone or space-charge zone mainly extends in the drift region 45, 10. The higher the drain-source voltage is, the deeper the depletion region extends into the drift regions 10 in the direction of the drain region 110. Within the depletion zone an n-type drift region such as drift region 10 of FIG. 3 includes positively charged ionized dopant atoms. These positive charges are associated with an electric field which acts across the interlayer 30 and causes sections of the compensation regions 20 to be depleted of charge carriers. This results in negative charges in the compensation regions 20. Thus, positive charges in the drift regions 10 find corresponding negative charges in the compensation region 20. Thus, the n and p columns are fully depleted and the space charge region results in a high voltage blocking capability.

In the embodiment illustrated in FIG. 3, the interlayers 30 are not continuous regions, but have openings in which the drift regions 10 and the compensation regions 20 adjoin one another. This has the advantage that hot charge carriers generated in one of the drift and compensation regions 10, 20 through the openings in the interlayers 30 can flow into the other one of the drift and compensation regions. This has three advantages: i) Generated minority carriers are exhausted more effectively, ii) the parasitic bipolar transistor formed by the source region 42, the body region 41, and the drift region 10 has a lower base current iii) exhausted hot carriers will not be injected into the interlayers 30. These advantages result in an enhanced reliability of the device, i.e. in less degradation.

While the operating principle of the device illustrated in FIG. 3 has been explained with reference to an n-type MOSFET, the drift region and compensation region structure 10, 20 illustrated in FIG. 3 is, of course, not limited to be implemented in an n-type MOSFET. The structure can also be applied in a p-type MOSFET which is different from an n-type MOSFET in that its semiconductor regions are doped complementarily relative to the semiconductor regions of an n-type MOSFET.

Figure 4:
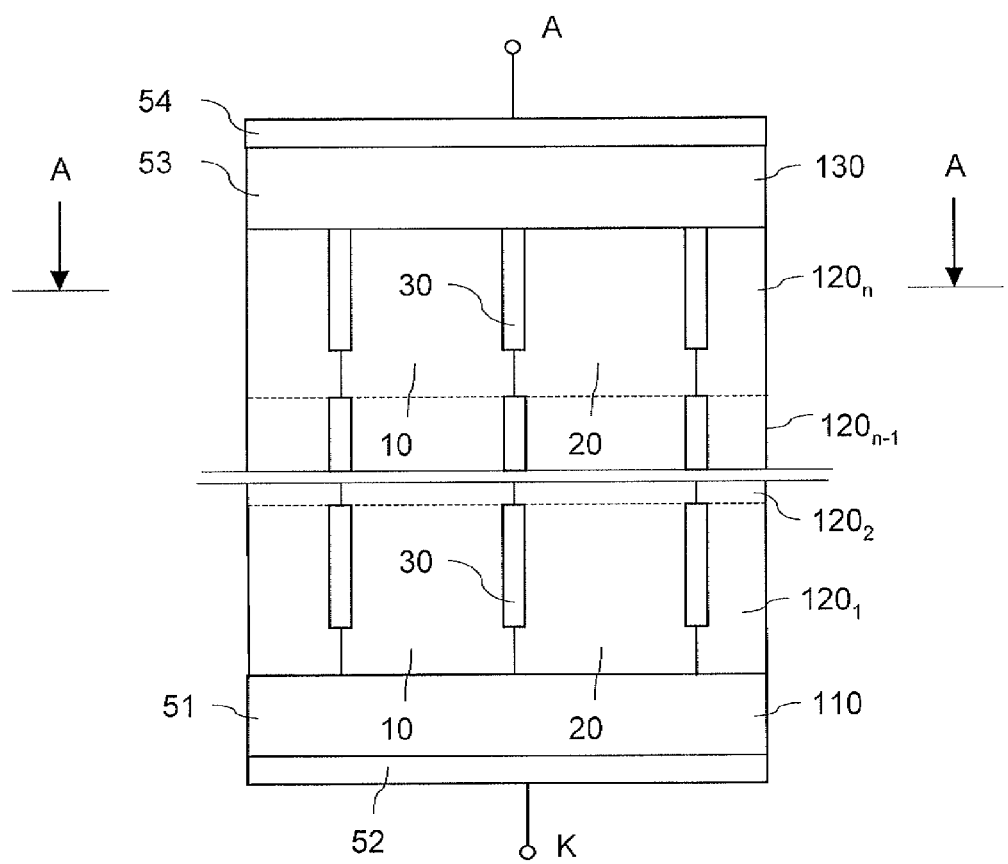
FIG. 4 illustrates an embodiment of a semiconductor device implemented as a diode with complementarily doped drift regions and compensation regions separated by interlayers.

FIG. 4 illustrates an embodiment of a power diode which is based on the semiconductor body with the drift region 10 and the compensation region 20 structure illustrated in FIG. 1F. The diode includes a first emitter region 51, like an n-emitter region which is formed by the first semiconductor layer 110, and a second emitter region 53, like a p-emitter region which is formed by the third semiconductor layer 130. The third semiconductor layer 130 is either produced to have a doping concentration which is sufficient to form the second emitter region 53, or is doped by implanting and/or diffusing dopants into the third semiconductor layer 130 after its production. The first emitter region 51 is contacted by a first electrode 52, which in the embodiment illustrated in FIG. 3 forms a cathode, and the second emitter region 53 is contacted by a second emitter electrode 54, which in the embodiment illustrated in FIG. 4 forms an anode of the power diode.

FIGS. 5A to 5E illustrate an embodiment of a method for producing the isolation segments 31 and the first and second dopant regions 11, 21 in the second semiconductor layers. In these figures a cross section through only one $120_i$ of the second semiconductor layers is shown. It goes without saying that this method can be applied to each of the second conductor layers. $120_i$ in FIGS. 5A to 5E denotes the second semiconductor layer, and $121_i$ denotes a first surface of the second semiconductor layer $120_i$.

Figure 5A:
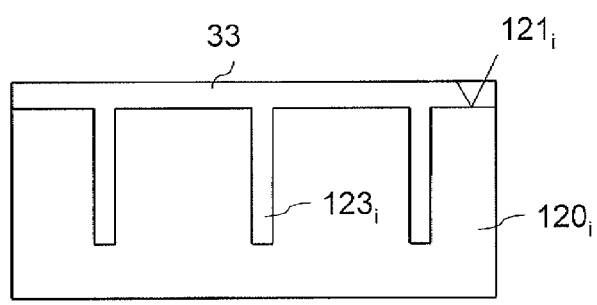
FIGS. 5A to 5E illustrates an embodiment of a method for producing first and second dopant regions which are separated by interlayer segments in a semiconductor layer.

FIG. 5A illustrates the second semiconductor layer after first method steps in which a plurality of trenches $123_i$ are formed, and in which these trenches $123_i$ are filled with a filling material. The filling material is, for example, a dielectric material, like an oxide, a nitride, or a high-dielectric (high-k) material. An oxide as the dielectric material can be deposited or thermally grown. Optionally, composite layers with two or more material layers are formed in the trenches $123_i$ by subsequently forming different material layers in the trenches $123_i$ and on the first surface $121_i$.

Figure 5B:
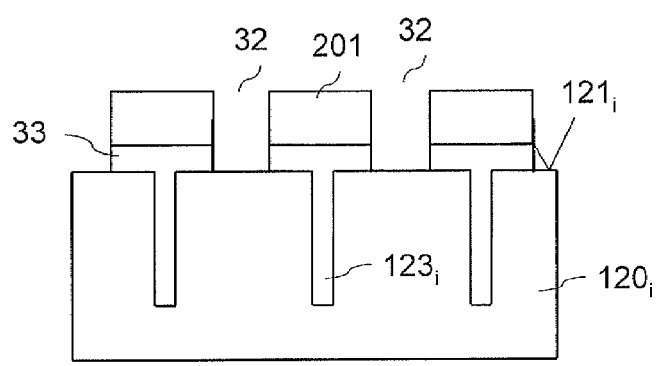

Referring to FIG. 5A a filling material layer 33 is produced such that the trenches $123_i$ are filled and such that the material layer covers the first surface $121_i$. Referring to FIG. 5B openings 32 are formed in the material layer 33 above the first surface $121_i$. These openings are, for example, formed using an etching process supported by an etch mask 201. The etch mask 201 covers those regions of the material layer 33 which are not to be removed. Sections of the material layer which are not to be removed are sections above the trenches 123$_i$.

Figure 5C:
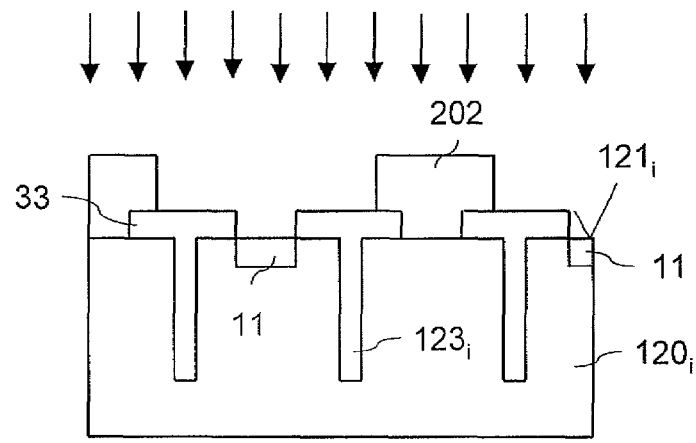
Figure 5D:
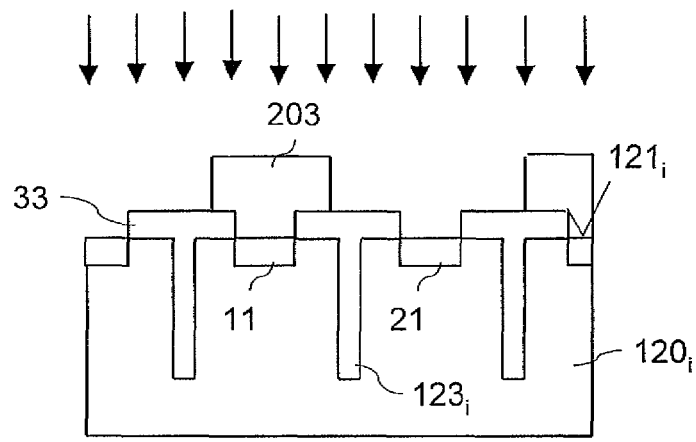

Referring to FIGS. 5C and 5D those sections of the material layer 33 which remain on first surface 121$_i$ form a part of an implantation mask used for implanting dopants of the first and second doping type into the second semiconductor layer 120$_i$. In FIG. 5C the implantation process for forming the first dopant regions 11 is shown. In this process additionally to the material layer 33 a mask 202 is employed which covers those openings 32 of the material layer 33 through which dopants of the second type are to be implanted for producing the second dopant regions 21 and which does not cover those openings through which dopants of the first doping type are to be implanted form producing the first dopant regions 11. Since the first and second dopant regions 11, 21 are arranged alternatingly, mask 202 covers each second opening 32 of the material layer 33. Referring to FIG. 5C dopants of the first doping type are implanted into the second semiconductor layer 120$_i$ through those openings not covered by mask 202, thereby forming the first dopant regions 11.

Referring to FIG. 5D, mask 202 is removed, and the openings of the material layer 33 through which the dopants of the first doping type were implanted are covered by a second mask 203. Further, dopants of the second doping type are implanted into the second semiconductor layer 120$_i$ through openings 31 not covered by the second mask 203, thereby forming the second dopant regions 21. In this method, the width of the first and second dopant regions 11, 21 are defined by the openings 32 produced in the material layer 33 above the first surface 121$_i$.

Figure 5E:
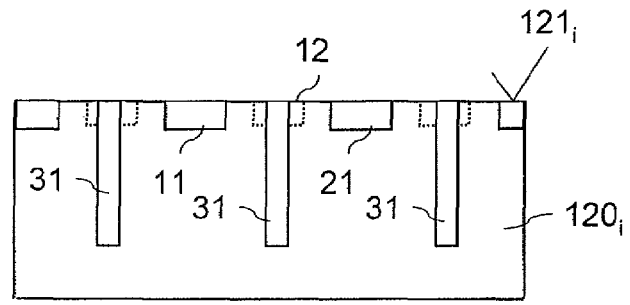

Referring to FIG. 5E the second mask 203 is removed, and the remaining sections of the material layer 33 are removed from the first surface 121$_i$, those sections of the material layer 33 remaining in the trenches 123$_i$ form the interlayer segments 31.

In the embodiment illustrated in FIG. 5E, the first and second dopant regions 11, 21 are arranged close the first surface. However, this is only an example. A distance in the vertical direction between these dopant regions 11, 21 and the surface 121 is dependent on the implantation energy with which the dopant atoms are implanted. According to a further embodiment, these dopant regions 11, 21 are produced to be arranged distant to the surface 121$_i$.

When producing the interlayers 30 to include a plurality of interlayer segments produced in the individual second semiconductor layer, such as the second semiconductor layer 120$_i$ of FIGS. 5A to 5E, a plurality of shallow trenches instead of one deep trench can be formed. In shallow trenches there is no significant offset between upper and lower trench sections due to an inclination of the trenches.

Figure 6:
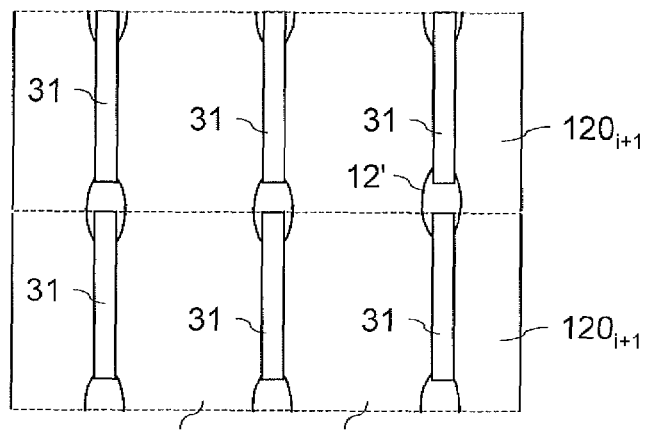
FIG. 6 illustrates a semiconductor arrangement obtained when modifying the method according to FIG. 5.

Referring to FIG. 5E, optionally further dopant regions 12 with dopants of the first doping type are formed below the first surface 121$_i$ along the interlayer segments 31. During the diffusion process (see FIG. 1F) these further dopant regions 12 result in higher doped regions of the first doping type at the border between two adjacent second semiconductor layers. In case the interlayer segments 31 are formed such that they do not adjoin one another in the vertical direction, the further dopant regions 12 result in higher doped semiconductor regions in the gap between two neighboring interlayer segments 31. This higher doped region of the first doping type reduces a diffusion of dopants of the second doping type from the compensation regions 20 into the drift regions 10. This is illustrated in FIG. 6, in which two adjacent second semiconductor layers 120$_i$, 120$_{i+1}$ are shown. In FIG. 6 reference character 12' denotes doping regions of the first doping type and which result from the diffusion of dopants of the first doping type from the further dopant regions 12 into the surrounding semiconductor material.

Figure 7:
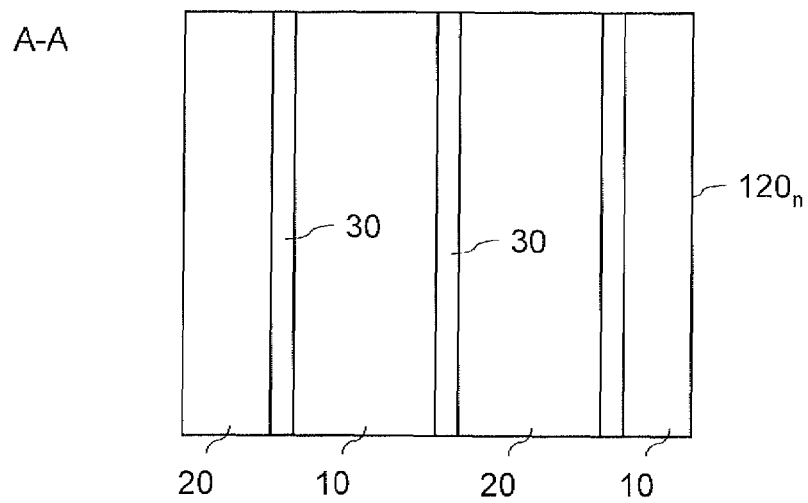
FIG. 7 illustrates a horizontal cross section through one of the semiconductor devices illustrated in FIGS. 3 and 4.

Referring to FIG. 7, which illustrates a horizontal cross section of the compensation and drift regions (see FIGS. 3 and 4) the interlayers 30 are, for example, produced to have a stripe-shaped geometry, i.e. these interlayers 30 are elongate layers in the second horizontal direction. Further cell geometries are possible like circles, hexagons or squares.

In the embodiments explained hereinabove the individual interlayer segments 31 which form an interlayer 30 are arranged distant to one another in the vertical direction and are aligned in the vertical direction, i.e. do not have an offset in the lateral direction. This, however, is only an example.

Figure 8:
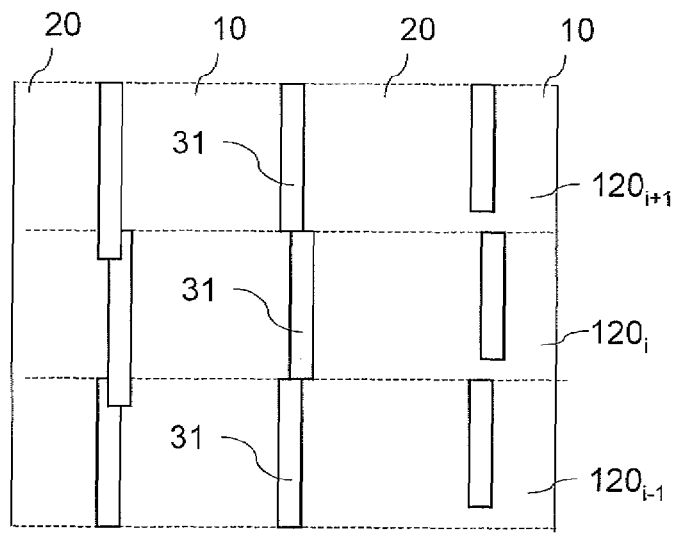
FIG. 8 illustrates a second embodiment of arranging interlayer segments in an arrangement with a plurality of semiconductor layers.

Referring to FIG. 8 the isolation segments 31 could also be produced in a different way. FIG. 8 illustrates three different alternatives of arranging the interlayer segments 31 in adjacent second semiconductor layers, wherein in FIG. 8 a cross section through only three adjacent second semiconductor layers 120$_{i-1}$, 120$_i$, 120$_{i+1}$ is illustrated.

According to a first alternative which is illustrated in the left section of FIG. 8, the interlayer segments 31 which are arranged one above another in the vertical direction overlap in the vertical direction and are arranged offset in the horizontal direction. The offset between the interlayer sections 31 in the horizontal direction is less than twice the width of the interlayer segments 31 so that a continuous interlayer 30 is provided. Interlayer segments 31 which overlap in the vertical direction can be produced by forming the trenches (see, for example, 123$_1$ in FIG. 1B) in one second semiconductor layer such that they extend into the underlying second semiconductor layer.

According to a second alternative which is illustrated in the mid section of FIG. 8, the interlayer segments 31 of one interlayer 30 adjoin one another in the vertical direction and are arranged offset in the horizontal direction. The offset between the interlayer sections 31 in the horizontal direction is less than twice the width of the interlayer segments 31 so that a continuous interlayer 30 is provided. Interlayer segments 31 which adjoin one another in the vertical direction can be produced by forming the trenches (see, for example, 123$_1$ in FIG. 1B) in one second semiconductor layer such that they extend through the corresponding second semiconductor layer.

According to a third alternative which is illustrated in the right section of FIG. 8, the interlayer segments 31 of one interlayer 30 are distant to one another in the vertical direction and are arranged offset in the horizontal direction. The offset between the interlayer sections 31 in the horizontal direction is less than the width of the interlayer segments 31.

The three alternatives illustrated in FIG. 8 could be modified to produce the interlayer segments 31 such that they are perfectly arranged one above the other or perfectly aligned in the vertical direction, i.e. do not have an offset in the horizontal direction. The in the right section of FIG. 8 then corresponds to the embodiment illustrated in FIGS. 1 and 3 to 5. Usually, the interlayers 30 implemented in one device have the same structure, like one of the geometries illustrated in FIG. 8. However, it is also possible to implement interlayers with different structures in one device.

Figure 9:
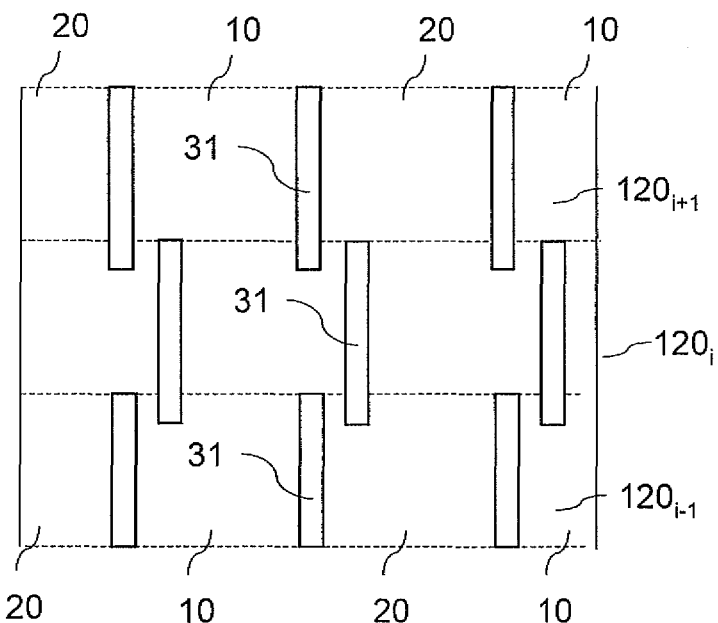
FIG. 9 illustrates a third embodiment of arranging interlayer segments in an arrangement with a plurality of semiconductor layers.
Figure 10:
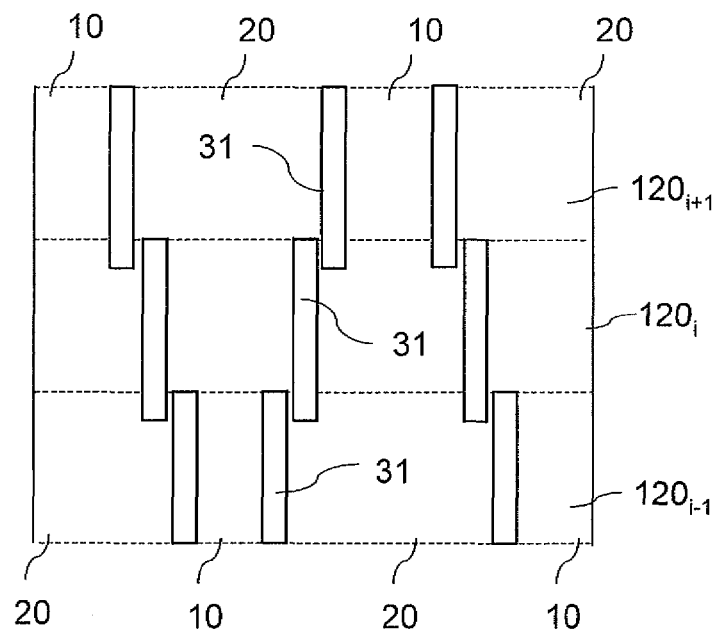
FIG. 10 illustrates a fourth embodiment of arranging interlayer segments in an arrangement with a plurality of semiconductor layers.

FIGS. 9 and 10 illustrate further embodiments of interlayers 30. In these embodiments, the interlayer segments 31 of two adjacent layer stack arrangements overlap in the vertical direction and are arranged offset to one another in the horizontal direction. The offset is more than the width of the interlayer segments 31, so that the individual interlayers 30 have gaps between a drift region 10 and the neighboring compensation region 20. These gaps in conjunction with the vertical overlap of the interlayer segments 31 result in a reduction of a lateral diffusion of the first and second doping type into the second and first doping region, respectively. In the embodiment illustrated in FIG. 10 the drift region 10 of the component becomes wider in the direction of the first semiconductor layer (110 in FIG. 1 and not illustrated in FIG. 10). When a component, like a MOSFET, with a drift region and compensation region structure illustrated in FIG. 10 is in its switched-on state and when a load voltage, like a drain-source-voltage, is larger than zero, there is space charge region in the drift region 10. This space charge region can pinch off a channel in the drift region 10, when the load voltage reaches a pinch-off value. By virtue of the widening drift region, the component of FIG. 10 has a higher pinch-off voltage than a component with uniform drift region 10.

Figure 11:
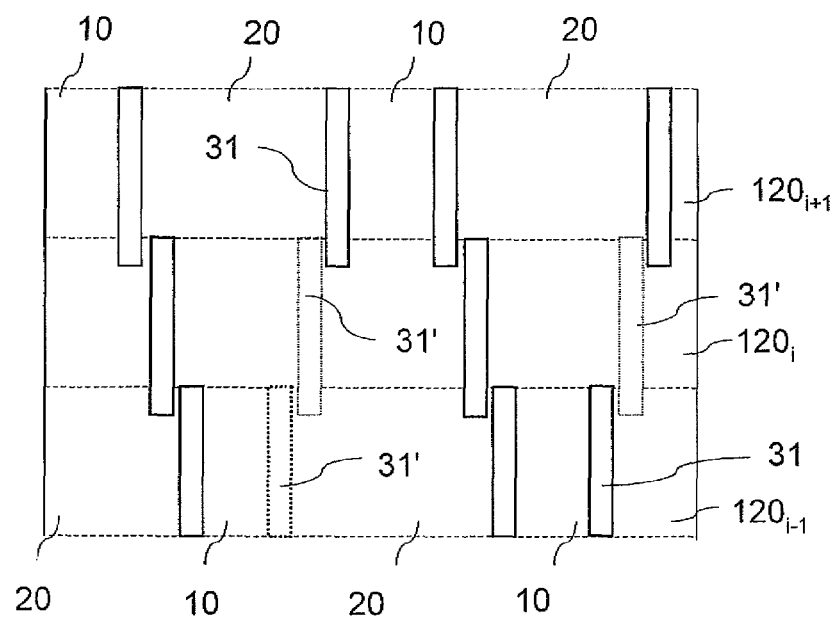
FIG. 11 illustrates a fifth embodiment of arranging interlayer segments in an arrangement with a plurality of semiconductor layers.

According to a further embodiment illustrated in FIG. 11, the interlayers 30 have gaps obtained by leaving away one interlayer segment. For a better understanding, the position where an interlayer segment is left away is schematically illustrated in FIG. 11 and has reference character 31'. The embodiment illustrated in FIG. 11 is based on the of FIG. 10. However, this is only example. Individual interlayer sections 31 can be left away in any of the interlayers explained hereinabove in order to obtain gaps in the interlayers between a drift region and a neighbouring compensation region. According to an interlayer segments are left away, i.e. gaps are present in those regions of the drift region 10 where an avalanche breakdown is expected to occur when the device reaches its blocking voltage capability.

In connection with FIG. 11 it should be mentioned that it is also possible to leave away interlayer segments 31 of one group in two or more adjacent layer stack arrangements.

In the embodiments explained hereinabove, first dopant regions 11 that form the first semiconductor regions or drift regions 10 in the completed component, and second dopant regions 21 that form the second semiconductor regions or compensation regions 20 in the completed component are implanted. In these embodiments the second semiconductor layers $120_i$ can have a low basic doping or can be intrinsic. According to a further embodiment, only one of the first and second dopant regions 11, 21 are implanted in order to form one of the first and second semiconductor regions 10, 20 while the other one of these first and second semiconductor regions 10, 20 is formed by the basic doping of the second semiconductor layer. According to one embodiment the second semiconductor layers $120_i$ have an n-type basic doping, wherein in the completed component the drift region 10 is formed by sections of the second semiconductor layers which have the basic doping. The compensation regions are formed from p-type second dopant regions 21 which are implanted in each of the second semiconductor layers $120_i$ before or after the interlayer sections are produced. In this case two interlayer segments 31 which are arranged distant from one another in the horizontal direction are in each case arranged between two second dopant regions 21, wherein a section of the first semiconductor region 10 is formed between these two interlayer segments.

Such method can be easily obtained from each of the methods explained hereinabove by simply producing the second semiconductor layers to have a basic doping of the first conductivity type and by leaving away the method steps for producing the first dopant regions.

The features explained herein with reference to one figure can be combined with features of other figures, even in those cases in which this has not explicitly been mentioned.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device with drift regions of a first doping type and compensation regions of a second doping type, comprising:

providing a first semiconductor layer;

forming a plurality of layer stack arrangements one above the other on the first semiconductor layer, each layer stack arrangement comprising at least one second semiconductor layer, a plurality of first dopant regions with dopants of the first doping type and a plurality of second dopant regions with dopants of the second dopant type, at least some of the first dopant regions and at least some of the second dopant regions being arranged alternatingly and distant from one another, and interlayer segments between at least some neighbouring first and second dopant regions, wherein the interlayer segments are formed separately for each of the layer stack arrangements, wherein the first dopant regions and the second dopant regions of two adjacent layer stack arrangements are formed such that at least some of the first dopant regions are arranged substantially one above the other in a first direction and at least some of the second dopant regions are arranged substantially one above the other in the first direction; and diffusing the dopants of the first and second dopant regions such that drift regions are formed from dopants of the first dopant regions, and such that compensation regions are formed from dopants of the second dopant regions.

2. The method of claim 1, wherein at least one of the layer stack arrangements includes exactly one second semiconductor layer.

3. The method of claim 1, wherein at least one of the layer stacks includes a plurality of more than one second semiconductor layer, and wherein in each of these second semiconductor layers a plurality of first and second dopant regions are formed.

4. The method of claim 1, wherein the first and second dopant regions are formed after forming the interlayer segments in each of the layer stack arrangements.

5. The method of claim 1, wherein the first and second dopant regions are formed before forming the interlayer segments in each of the plurality of layer stack arrangements.

6. The method of claim 1, wherein forming the interlayer segments in each of the layer stack arrangements comprises:

forming trenches extending from one surface of the layer stack arrangement into the layer stack arrangement; and filling the trenches with an interlayer material.

7. The method of claim 6, wherein the interlayer material is a dielectric material.

8. The method of claim 7, wherein the dielectric material comprises at least one of an oxide, a nitride, and a high-k material, or a combination of at least two of an oxide, a nitride, and a high-k material.

9. The method of claim 1, wherein at least some of the interlayer segments of two adjacent layer stack arrangements are produced to be arranged distant to one another in the first direction.

10. The method of claim 1, wherein at least some of the interlayer segments of two adjacent layer stack arrangements are produced to adjoin one another.

11. The method of claim 1, wherein at least some of the interlayer segments of two adjacent second layer stack arrangements are produced to overlap one another in the first direction.

12. The method of claim 1, wherein at least some of the interlayer segments of two adjacent second semiconductor layers are produced to be arranged offset to one another in a second direction which is perpendicular to the first direction.

13. The method of claim 12, wherein the offset is less than twice the width of the interlayer segments.

14. The method of claim 12, wherein the offset is more than twice the width of the interlayer segments.

15. The method of claim 14, wherein the offset is less than four times the width of the interlayer segments.

16. The method of claim 1, further comprising:
forming a third semiconductor layer on an arrangement with the plurality of the layer stack arrangements; and
forming at least one first active component region in the third semiconductor layer.

17. The method of claim 16, further comprising:
forming body regions and source regions in the third semiconductor layer.

18. A semiconductor device, comprising:
a plurality of drift regions of a first doping type and a plurality of compensation regions of a second dopant type, the plurality of the drift zone regions and the plurality of compensation regions being arranged alternatingly,
wherein each of the drift regions and each of the compensation regions extend across a plurality of semiconductor layers arranged one above the other in a first direction, and
wherein at least some of the drift regions are each at least partly separated from a neighbouring compensation region by an interlayer which includes a plurality of interlayer segments arranged in the semiconductor layers; and
wherein the semiconductor device is a MOSFET that further includes a source region of the first doping type and a body region of the second doping type, wherein the body region is arranged between the source region and a drift region and adjoins a compensation region.

19. The semiconductor device of claim 18, wherein at least some of the interlayer segments of one interlayer are arranged distant from one another in the first direction.

20. The semiconductor device of claim 18, wherein at least some of the interlayer segments of one interlayer adjoin one another.

21. The semiconductor device of claim 18, wherein at least some of the interlayer segments of one interlayer in the horizontal direction are arranged offset relative to an interlayer segment in an adjoining semiconductor layer.

22. The semiconductor device of claim 21, wherein the offset is less than twice the width of the interlayer segments.

23. The semiconductor device of claim 21, wherein the offset is more than twice the width of the interlayer segments.

24. The semiconductor device of claim 23, wherein the offset is less than four times the width of the interlayer segments.

* * * * *